United States Patent
Kienzler et al.

(10) Patent No.: US 7,420,316 B2
(45) Date of Patent: Sep. 2, 2008

(54) ACTUATOR UNIT FOR A PIEZO-CONTROLLED FUEL INJECTION VALVE

(75) Inventors: Dieter Kienzler, Leonberg (DE); Dietmar Uhlmann, Korb (DE)

(73) Assignee: Robert Bosch GmbH, Stuttgart (DE)

( * ) Notice: Subject to any disclaimer, the term of this patent is extended or adjusted under 35 U.S.C. 154(b) by 490 days.

(21) Appl. No.: 10/538,033

(22) PCT Filed: Mar. 19, 2004

(86) PCT No.: PCT/DE2004/000565

§ 371 (c)(1),
(2), (4) Date: Jun. 8, 2005

(87) PCT Pub. No.: WO2004/097208

PCT Pub. Date: Nov. 11, 2004

(65) Prior Publication Data

US 2006/0113870 A1 Jun. 1, 2006

(30) Foreign Application Priority Data

May 2, 2003 (DE) .............................. 103 19 600

(51) Int. Cl.
*H01L 41/08* (2006.01)
*H02N 2/04* (2006.01)
*F16F 1/02* (2006.01)

(52) U.S. Cl. ...................................... 310/311
(58) Field of Classification Search .................. 310/311
See application file for complete search history.

(56) References Cited

U.S. PATENT DOCUMENTS

| 4,919,403 | A | * | 4/1990 | Bartholomew | 267/165 |
|---|---|---|---|---|---|
| 4,958,101 | A | | 9/1990 | Takahashi et al. | |
| 6,681,462 | B1 | * | 1/2004 | Frank et al. | 29/25.35 |
| 6,873,085 | B2 | * | 3/2005 | Graham et al. | 310/266 |
| 7,175,112 | B2 | * | 2/2007 | Uhlmann | 239/533.9 |
| 7,222,424 | B2 | * | 5/2007 | Jovovic et al. | 29/896.6 |
| 2002/0086199 | A1 | * | 7/2002 | Gibb et al. | 429/37 |
| 2003/0034594 | A1 | | 2/2003 | Schmieder et al. | |

FOREIGN PATENT DOCUMENTS

| DE | 101 27 583 A1 | 12/2002 |
|---|---|---|
| DE | 101 40 196 A1 | 3/2003 |
| FR | 2 257 822 A1 | 8/1975 |
| WO | WO 00/08353 A1 | 2/2000 |
| WO | WO 03/033933 A1 | 4/2003 |
| WO | WO 03033933 A1 * | 4/2003 |

* cited by examiner

*Primary Examiner*—Jaydi A San Martin
(74) *Attorney, Agent, or Firm*—Ronald E. Greigg (57) ABSTRACT

An actuator unit suitable for actuating a fuel injection valve of an injection system for internal combustion engines is comprised of a piezoelectric actuator and a hollow body embodied in the form of a spring. Embodying the hollow body according to the present invention can extend the service life of the actuator unit.

27 Claims, 13 Drawing Sheets

ACTUATOR UNIT FOR A PIEZO-CONTROLLED FUEL INJECTION VALVE

CROSS-REFERENCE TO RELATED APPLICATIONS

This application is a 35 USC 371 application of PCT/DE 2004/000565 filed on Mar. 19, 2004.

BACKGROUND OF THE INVENTION

1. Field of the Invention

The invention relates to an improved actuator unit comprised of a piezoelectric actuator.

2. Description of the Prior Art

Actuator units of the type with which this invention is concerned are use among other things in fuel injection systems and in particular in fuel injection valves since the switching times of such actuator units are very short. The short switching times permit a more exact metering of the injected fuel quantity and permit an improved shape of the injection curve over time. In connection with the present invention, the generic term "fuel injection valve" is understood to mean all types of fuel injection values, for example, the injectors for common rail injection systems or injection nozzles of conventional fuel injection systems. A fuel injection valve with a piezoelectric actuator is triggered by applying an electric voltage to the piezoelectric actuator; this causes a rapid expansion of the piezoelectric actuator due to known physical effects of piezoelectric ceramic and causes a valve-closure member to lift away from a valve seat. The piezoelectric actuator has a certain mass that is accelerated in the course of this. If the voltage applied to the actuator is reduced, this causes the actuator to contract. As a function of the triggering speed, the inertia of the previously accelerated mass of the actuator generates damaging tensile forces in the piezoelectric actuator, in particular causing fractures in the soldered connections between the individual layers of the piezoelectric actuator. In order to prevent this kind of damage, it has become common practice to use a cylindrical hollow body in the form of a spring to prestress the piezoelectric actuator in the axial direction. A device of this kind is known, for example, from WO 00/08353 (Siemens). This hollow body is bent from a flat metal sheet and welded at the first joint thus produced. The first joint extends parallel to the longitudinal axis of the hollow body.

Among other things, the welding of the first joint has the following disadvantages: the welding causes a generally undesirable structural change to the hollow body in the immediate vicinity of the welding seam. A second problem is the spatters produced during the welding, which can lead to difficulties in assembly of the actuator unit or can even lead to functional failures of the fuel injection valve when one or more spatters come loose during operation. A third problem is a sinking-in of the welding seam (seam sinkage) at the beginning and end of the welding seam and the resulting notch effect and voltage spikes.

SUMMARY AND ADVANTAGES OF THE INVENTION

The actuator unit according to the present invention has a hollow body and a piezoelectric actuator. The hollow body is elastically embodied, prestresses the actuator, is provided with apertures recesses, has a joint extending parallel to the longitudinal axis, has a bridge piece between each pair of recesses, and has a first end and a second end. According to the present invention, the recesses adjacent to the joint are smaller than the rest of the recesses.

Alternatively, it is also possible according to the present invention for the bridge piece between a recess adjacent to the joint and another recess adjacent to that recess to be wider than the bridge pieces between the rest of the recesses.

A disadvantage in actuator units with hollow bodies whose joints are not closed is that the spring rigidity in the axial direction is not constant over the entire circumference. As a rule, the spring rigidity of the hollow body is reduced in the region of the joint. This causes the hollow body to act on the piezoelectric actuator with forces in the axial and radial direction in addition to bending moments. This results in the uneven exertion of forces and bending moments on the piezoelectric actuator, which is undesirable.

The embodiments according to the present invention, which can be comprised in embodying the recesses adjacent to the joint as smaller than the rest of the recesses of the blank and/or embodying the bridge pieces in the region of the joint as wider than in the rest of the blank, serve to intentionally reinforce the hollow body in the regions in the immediate vicinity of the joint so as to compensate for the reduction in the spring rate in the region of the joint. It is therefore possible to achieve a spring rate of the hollow body that is constant and/or rotationally symmetrical over its entire circumference so that the piezoelectric actuator that the spring force of the hollow body acts on is loaded with forces exclusively the axial direction and not with lateral forces or bending moments. This can significantly extend the service life of actuator units equipped with a hollow body according to the present invention. It has turned out to be advantageous if the ratio of the width of a bridge piece between a recess adjacent to the joint and a recess adjacent to that recess to the width of the remaining bridge pieces of the blank has a value between 1.3 and 1.9, preferably 1.6. This means that the bridge pieces in the immediate vicinity of the joint are wider, for example by a factor of 1.6, than the rest of the bridge pieces of the blank.

In special cases, it can also be helpful to embody the width of the bridge pieces as a function of the load; the widths of the bridge pieces can differ from one another by up to a factor of 3.

The recesses in the blank are advantageously disposed so that when the blank is formed into a hollow body, they are disposed in planes and the planes extend parallel to one another. This improves the behavior of the hollow body and makes it easier to manufacture.

It is particularly advantageous if the recesses are disposed in an odd number of planes in the axial direction. In exemplary embodiments that were tested in practice, 15 or 17 turned out to be an advantageous number of planes. Providing an odd number of planes in the blank assures that the uppermost and lowermost planes are the same so that the behavior of the hollow body at its upper end is the same as the behavior of the hollow body at its lower end. This measure also improves the behavior of the hollow body in that at its end faces, the hollow body only transmits axially oriented spring forces to the piezoelectric actuator, a booster piston of a hydraulic coupler, or another component of the injector.

It has also turned out to be advantageous if a number of recesses are disposed one after another in a plane and this plane forms a right angle with the longitudinal axis of the hollow body. It is particularly advantageous if there is an even number of recesses in a plane. This arrangement results in the fact that the spring rate is constant over the circumference of the hollow body and consequently, no lateral forces are transmitted to the actuator.

For reasons involving the manufacture and durability of the hollow body, it has turned out to be advantageous if the recesses are embodied as bone-shaped and extend lateral to a longitudinal axis of the hollow body.

The "bone-shaped" geometry of the recesses can be described in that the recesses are comprised of a middle piece and two head pieces; the head pieces have at least a first radius, the middle piece has a second radius, and the recesses have a length. Various trials have shown various proportions to be favorable among the principle measurements of the first radius ($R_1$), the second radius ($R_2$), and the length (L), as well as the width of the bridge piece at the joint in relation to the width of the rest of the bridge pieces:

In a favorable embodiment form, the radius $R_1$ of a recess adjacent to the joint is smaller by a factor of 0.867 than the radius $R_1$ of the rest of the recesses. In addition, the second radius $R_2$ of a recess adjacent to the joint is larger by a factor of 1.317 than the radius $R_2$ of the rest of the recesses of the blank. Moreover, the length of a recess adjacent to the joint is shorter by a factor of 0.984 than the length of the rest of the recesses. The width of the bridge piece at the joint is expressed by the equation $b>a/2$; in particular $b=1.4 \cdot a/2$. A detailed description of the related values, in particular the values "a" and "b," is given below in conjunction with the drawings.

In another exemplary embodiment, it has also turned out to be advantageous if the recesses adjacent to the joint have the following dimensions:

$R_1$=0.35 mm-0.43 mm, in particular 0.39 mm
$R_2$=4.0 mm-8.9 mm, in particular 5.0 mm to 7.9 mm
L=3.5 mm-4.5 mm, in particular 4.0 mm.

In another embodiment form, the recesses adjacent to the joint have the following dimensions:

$R_1$=0.41 mm-0.49 mm, in particular 0.45 mm
$R_2$=5.5 mm-6.5 mm, in particular 6.0 mm
L=3.7 mm-4.7 mm, in particular 4.2 mm.

For the rest of the recesses that are not adjacent to the joint, the following dimensions have turned out to be favorable:

$R_1$=0.43 mm-0.51 mm, in particular 0.47 mm
$R_2$=4.0 mm-4.8 mm, in particular 4.4 mm
L=4.5 mm-5.5 mm, in particular 5.0 mm.

In another advantageous exemplary embodiment, the recesses that are not adjacent to the joint have the following dimensions:

$R_1$=0.4 mm-0.5 mm, in particular 0.45 mm
$R_2$=5.5 mm-6.5 mm, in particular 6.0 mm
L=4.0 mm-4.5 mm, in particular 4.255 mm.

It has also turned out to be advantageous if the first radii of the head pieces of a recess adjacent to the joint are different from each other, which will be explained by way of example below in conjunction with FIG. 8c.

It is also advantageous if the recesses of two adjacent planes are offset from one another. It is particularly advantageous if the offset of the recesses of two adjacent planes is equal to half the repeat pattern of the recesses of a plane. The term "repeat pattern" will be explained in greater detail below in conjunction with FIG. 2. It is particularly advantageous if the hollow body has a circular cross section or if the cross section of the hollow body is the shape of a regular polygon.

According to the present invention, the hollow body can also have a region that is not perforated by recesses at its first end and/or at its second end. As a result of this, the spring force transmitted by the hollow body to a cover plate or another component of the injector is comparatively uniform since the hollow body is intentionally reinforced in the region of its ends. This translates into a reduction in the maxima of the spring force over the circumference of the hollow body and further alleviates the problem of lateral forces introduced into the piezoelectric actuator by the hollow body.

The hollow body according to the present invention can be used in actuator units in which the piezoelectric actuator is disposed inside the hollow body and in which the prestressed hollow body acts on the piezoelectric actuator with compression. This means that the hollow body itself is loaded with tension.

The hollow body according to the present invention can, however, also be used in actuator units in which the piezoelectric actuator is disposed outside the hollow body and the prestressed hollow body acts on the piezoelectric actuator with compression. In this case, the hollow body is usually loaded with compression.

In order to be able to transmit the prestressing force of the hollow body to the piezoelectric actuator in the best possible way, it is advisable for the first end of the hollow body to be connected to an upper cover plate or an adjusting disk and for its second end to be connected to a lower cover plate or a coupler housing. These connections can be produced, for example, by means of welding or crimping.

If only a radial fixing of the hollow body is required, then this can occur by means of an annular groove or a shoulder in the upper and/or lower cover plate or in the adjusting disk and coupler housing. This can be sufficient, for example, if the hollow body is loaded not with tension but with compression. In these embodiment variants, it is particularly advantageous that the annular groove and the shoulder center the hollow body in relation to the piezoelectric actuator or to the hydraulic coupler. This effect can be further improved if the annular groove and shoulder are dimensioned so that they cause the hollow body to flare slightly during assembly.

BRIEF DESCRIPTION OF THE DRAWINGS

The foregoing and other features and advantages will become apparent from the description herein below, taken with the drawings, in which.

DESCRIPTION OF THE PREFERRED EMBODIMENTS

Figure 1:
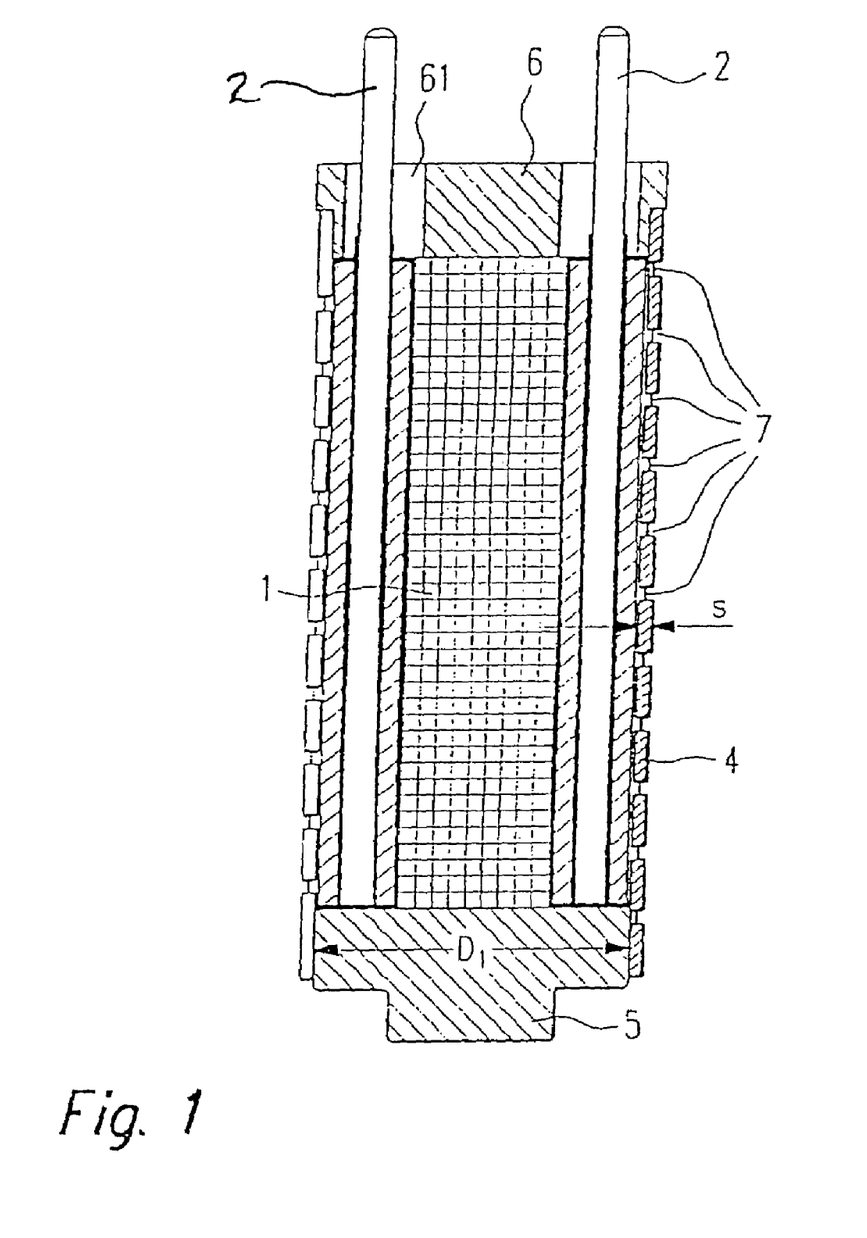
FIG. 1 shows a first exemplary embodiment of an actuator unit according to the present invention.

FIG. 1 shows a first exemplary embodiment of an actuator unit according to the present invention. The actuator unit is comprised of a piezoelectric actuator 1, which can be comprised of a number of stacked individual piezoelectric elements (not shown). The piezoelectric actuator 1 is triggered via contacting pins 2 that are disposed alongside the actuator 1 and are connected to the actuator 1 in an electrically conductive fashion. The application of a voltage between the contact pins 2 produces a longitudinal expansion of the piezoelectric actuator 1, which is used, for example, to control an injection valve in an internal combustion engine. The piezoelectric actuator 1 with the contact pins 2 is disposed inside a hollow body 4 embodied in the shape of a tubular spring. The ends of the piezoelectric actuator 1 each rest against a respective cover plate 5, 6, the upper cover plate 6 being provided with feedthroughs 61 through which the contact pins 2 extend. The upper and lower cover plate 5, 6 are each connected to the hollow body 4 in a form-locked manner and/or by frictional engagement, preferably by means of welding. The welding seams between the upper and lower cover plate 5, 6 and the hollow body 4 are not shown in FIG. 1. Alternatively, the connection between the hollow body and the two cover plates 5, 6 can also be produced, for example, by means of a crimp, the crimped upper and lower edge regions of the hollow body 4 each engaging with the cover plates 5, 6 (not shown).

The hollow body 4 and the cover plates 5, 6 act on the piezoelectric actuator 1 with compression by means of a prestressing force. This means that before being welded to the upper and lower cover plate 5, 6, the hollow body 4 is prestressed and then welded.

The hollow body 4 is preferably made of spring steel. The hollow body 4 is provided with a multitude of apertures, recesses 7 in order to be able to set a desired spring rate with a predetermined wall thickness "s." For the sake of clarity, not all of the recesses in FIG. 1 are provided with reference numerals. Since the multitude of recesses 7 can best be produced by means of punching, the hollow body 4 is as a rule comprised of sheet metal. First, a blank with the recesses 7 is stamped out of the metal sheet. Then, the blank is bent until it has a circular cross section, for example, or a cross section in the shape of a regular polygon. This produces a first joint where the two ends of the bent blank meet each other (not shown in FIG. 1).

Figure 2:
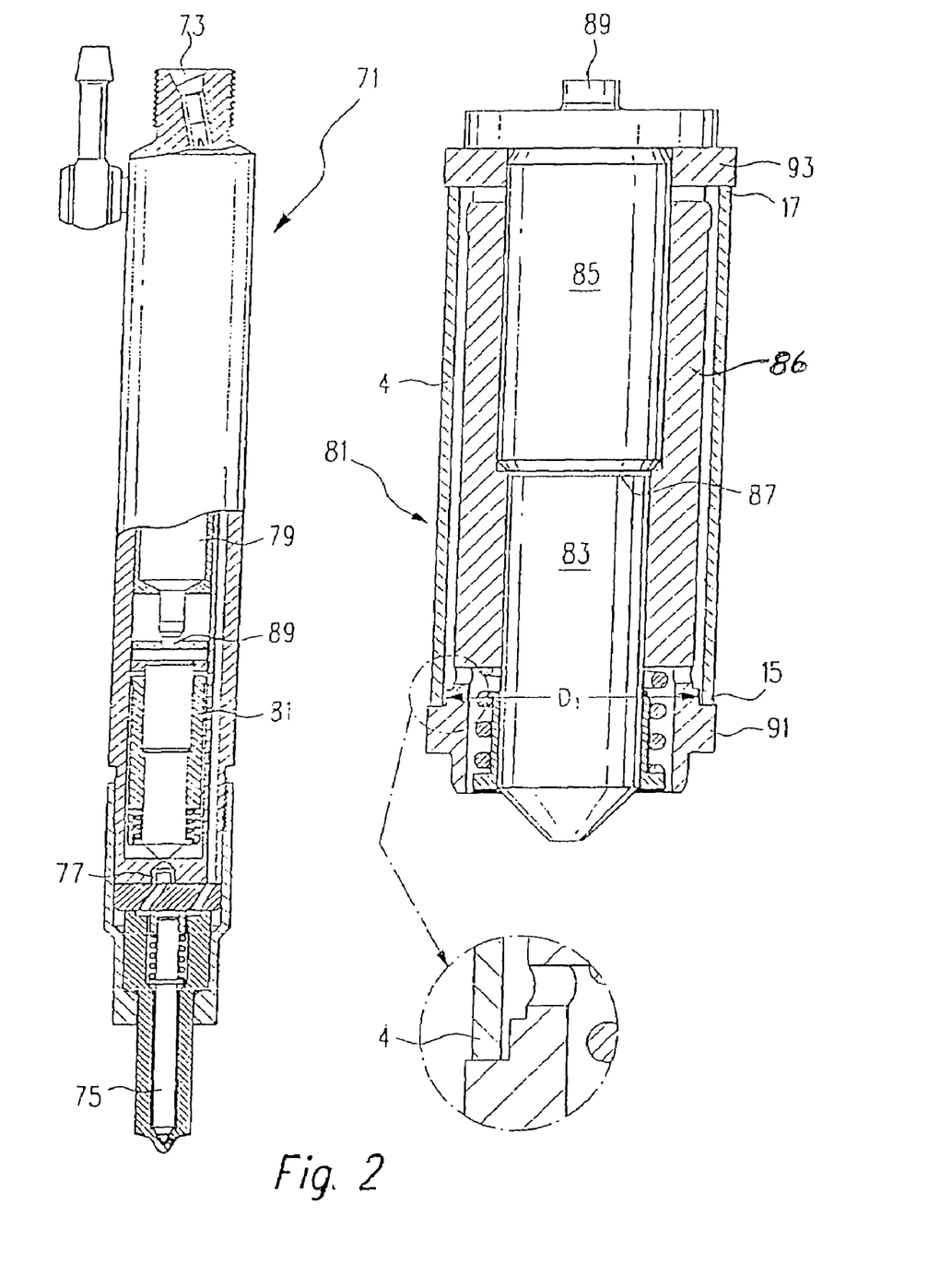
FIG. 2 shows a second exemplary embodiment of an actuator unit according to the present invention.

FIG. 2 shows a second exemplary embodiment of an actuator unit according to the present invention, which is integrated into a piezoelectrically actuated injector 71.

Since the present invention essentially relates to an actuator unit and a hollow body 4 associated with it, not all of the details the injector 71 are explained; instead, essentially only the connection of the actuator unit to the injector 71 is described. The remaining functionalities of the injector 71 are already known to those skilled in the art in the field of injection technology and therefore require no further explanation.

The injector 71 has a high-pressure connection 73. Highly pressurized fuel (not shown) is supplied to the injector 71 via the high-pressure connection 73. If an injection into the combustion chamber, not shown, of an internal combustion engine is to take place, a nozzle needle 75 lifts away from its seat, not shown, and unblocks injection orifices that are also not shown. A piezoelectric actuator 79 actuates a control valve 77, which controls the nozzle needle 75. Between the piezoelectric actuator 79 and the control valve 77, a hydraulic coupler 81 is provided, an enlargement of which is depicted on the right side of FIG. 2.

The hydraulic coupler 81 is essentially comprised of a valve piston 83 and a booster piston 85 that are guided in a coupler housing 86. Between the valve piston 83 and the booster piston 85, there is a coupler gap 87, which is filled with fuel (not shown). This coupler gap 87 is required, among other reasons, because the thermal expansion coefficients of the piezoelectric actuator 79 and the metallic components of the injector 71 differ greatly from each other.

By means of its valve piston 83, the hydraulic coupler 81 actuates the control valve 77, while a projection 89 of the booster piston 85 rests against the piezoelectric actuator 79. A hollow body 4 according to the present invention, which is prestressed with compression, presses the booster piston 85 against the piezoelectric actuator 79, thus acting on it with a compressive prestressing force. The first end 15 of the hollow body 4 rests against a shoulder 91 of the coupler housing 86. The second end 17 of the hollow body 4 rests against an adjusting disk 93. The adjusting disk 93 transmits the spring force of the hollow body 4 to the projection 89 of the booster piston 85 and therefore to the piezoelectric actuator 79.

In order to position the hollow body 4 concentric to the hydraulic coupler 81 and therefore also concentric to the piezoelectric actuator 79, the diameter $D_1$ of the shoulder 91 is matched to the inner diameter of the hollow body 4 so that the hollow body 4 flares slightly when it is slid onto the shoulder 91. Since the hollow body 4 according to the present invention has a first joint 31 (not shown) extending over the entire length of the hollow body 4, this allows the hollow body 4 to flare relatively easily so that it fits onto the shoulder 91.

If, as in the exemplary embodiment according to FIG. 1, the hollow body 4 is acted on with a compressive prestressing force, then it is sufficient for it to be supported in the axial direction at its ends 17 and 15, as shown in FIG. 1. In order to further improve the radial fixing of the hollow body 4, an annular groove (not shown) can alternatively or additionally be provided in the shoulder 91 and/or in the adjusting disk 93.

Figure 3:
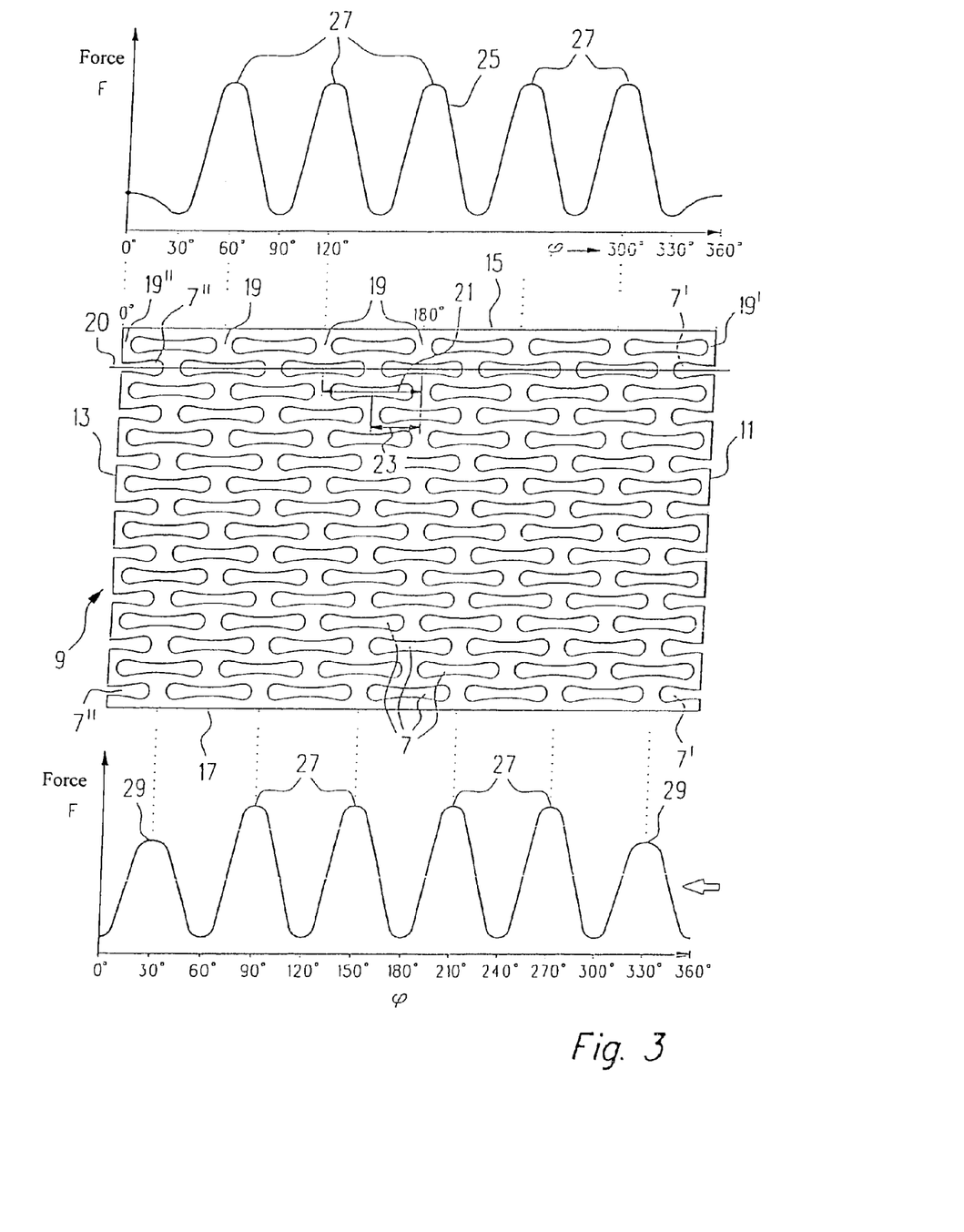
FIG. 3 shows an example for a blank from which a hollow body is bent.

FIG. 3 shows a blank 9 that can be curved to form a hollow body 4 according to the present invention. A multitude of recesses 7 are stamped out of the blank 9. For the sake of clarity, reference numerals are not provided for all of the recesses 7, which are bone-shaped in the exemplary embodiment according to FIG. 2. The blank 9 is rectangular; two opposite edges 11 and 13 of the blank 9 are interrupted by the recesses 7, while the opposite edges 15 and 17 extend in straight lines, uninterrupted by the recesses 7.

The blank 9 is curved or bent to form a cylindrical or polygonal hollow body so that the edges 15 and 17 constitute the first end 15 and the second end 17 of the hollow body 4 (see FIG. 4), i.e. the longitudinal axis 35 not shown in FIG. 2 (see FIG. 4) of the hollow body 4 extends parallel to the edges 11 and 13.

When the blank 9 is bent in the above-mentioned fashion to form a cylinder or polygon, the edges 11 and 13 touch each other and form a first joint 31 (see FIGS. 4 and 5), which extends parallel to the longitudinal axis 35 of the hollow body 4.

The blank 9 contains groups of recesses 7, each of which comprises a number of recesses in a row. The recesses are separated from one another by bridge pieces 19. Here, too, for the sake of clarity, not all of the bridge pieces 19 of the blank 9 have been provided with reference numerals. When the blank 9 is bent to form a hollow body in the manner described above, the recesses 7 disposed in a row lie in a plane. By way of example, a line 20 in FIG. 3 indicates a row of recesses 7 that are disposed one after another. In the exemplary embodiment of a blank 9 shown in FIG. 3, sixteen rows of six recesses 7 are disposed between the edge 15 and the edge 17.

As is clear from FIG. 3, the recesses 7 of two adjacent rows are offset from one another. The offset is selected so that it corresponds to half of the length of one recess 7 and one bridge piece 19. This measurement for one recess and two half bridge pieces 19 is indicated by way of example in FIG. 3 by the double arrow 21. This measurement is also referred to as the "repeat pattern." The offset between the recesses 7 of two adjacent rows of recesses is labeled with the reference numeral 23 in FIG. 3.

Figure 4:
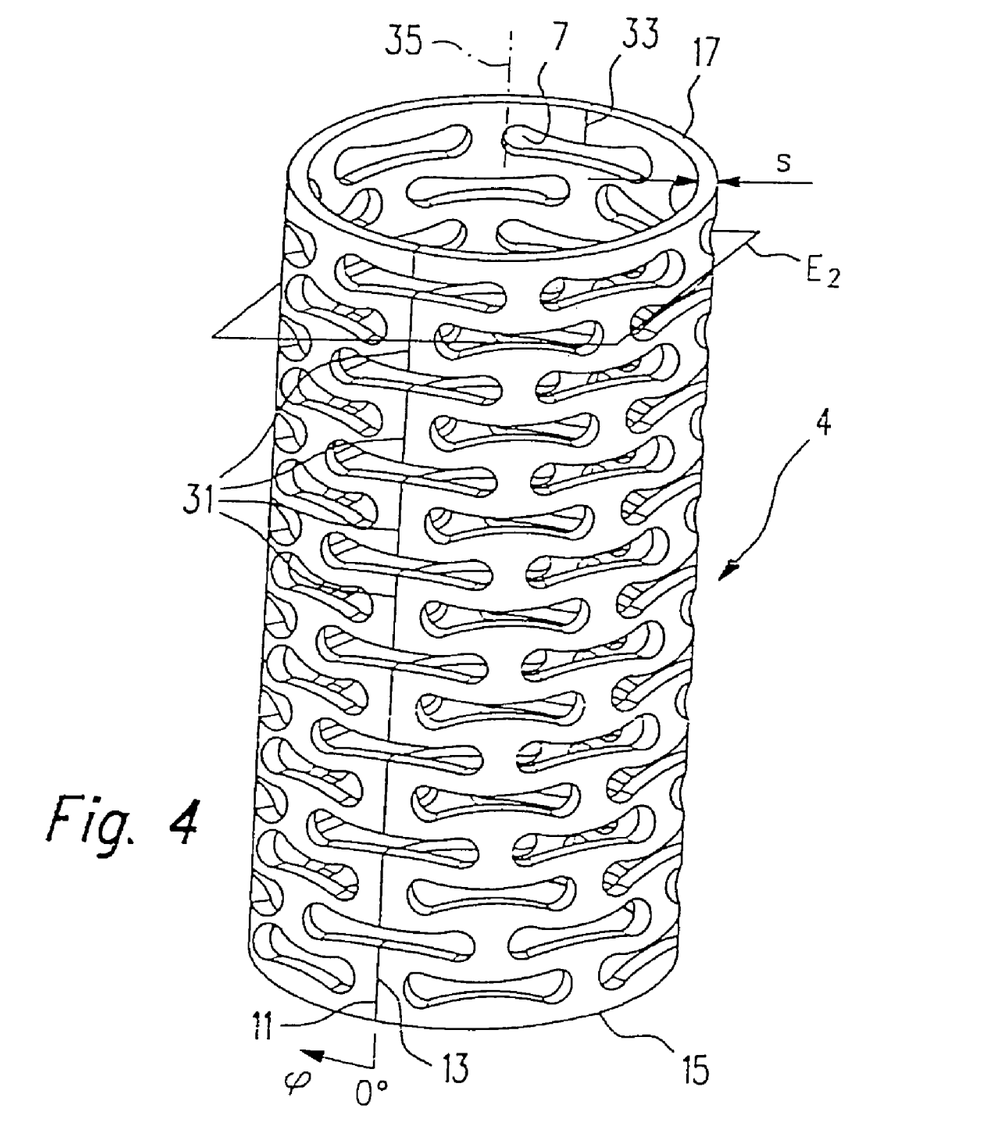
FIG. 4 shows a perspective view of a first exemplary embodiment of a hollow body.
Figure 5:
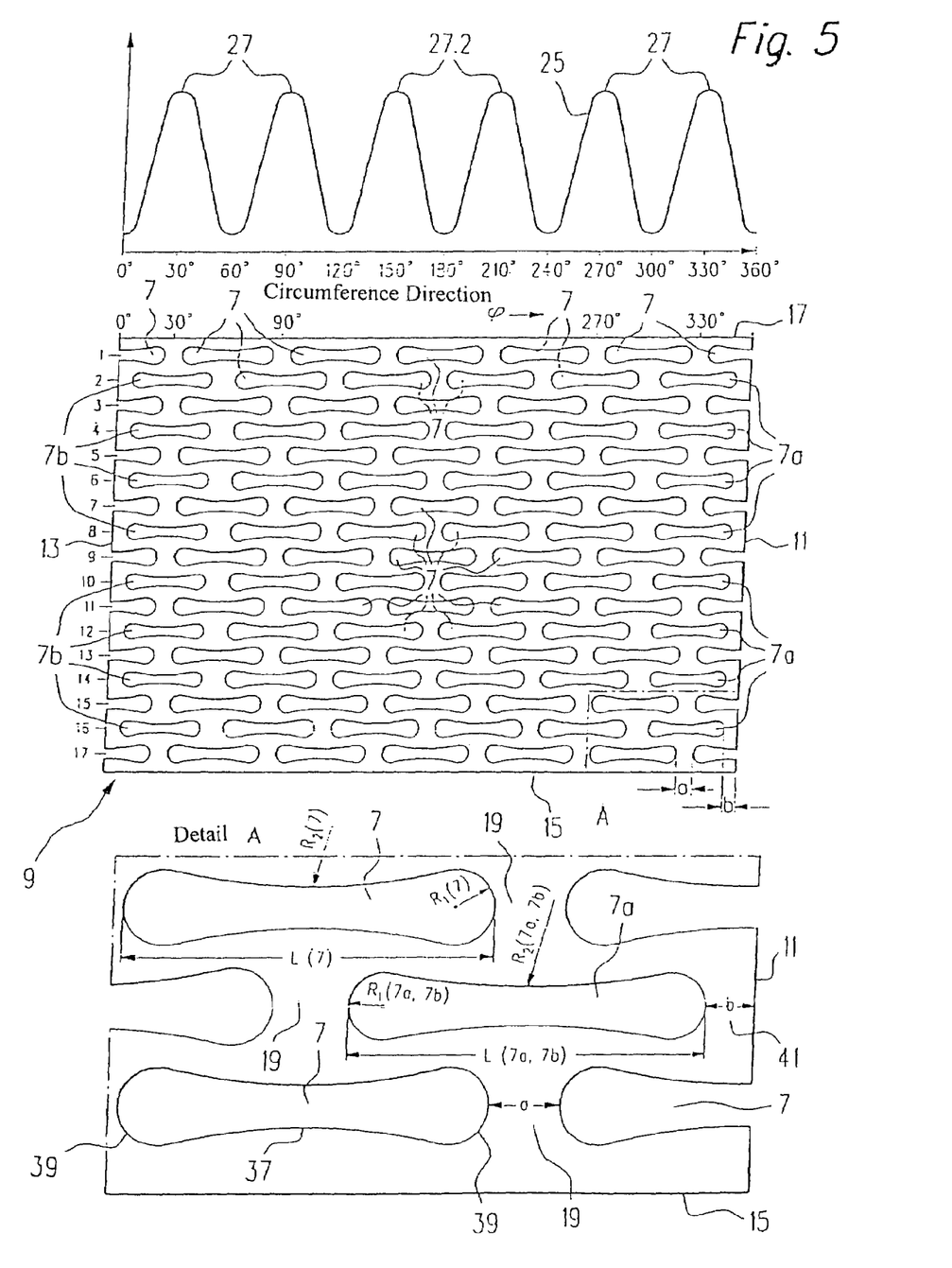
FIG. 5 shows an exemplary embodiment of a blank from which a hollow body according to the present invention is bent.

When the blank 9 is rolled to form a hollow body 4 (see FIG. 4) and the ends of this hollow body 4 are acted on with a compressive force via an upper cover plate 5 (see FIG. 1) and a lower cover plate 6 (see FIG. 1), then the force F acting between the upper cover plate 5 and the edge 15 over the circumference of the hollow body 4 has the curve qualitatively depicted by the line 25 (see FIG. 5). The circumference angle φ begins with 0° at the edge 13 and ends with 360° at the edge 11.

It is clear that wherever a bridge piece 19 "supports" the edge 15, a large force F can be transmitted, as indicated by the maxima 27 of the line 25. The sole exception is where the edges 11 and 13 abut each other. The "cut" recess 7 there, with its parts 7' and 7", weakens the structure of the blank 9 so that the force F transmitted between the upper cover plate 5 and the hollow body 4 is weaker at this point. This fact is indicated in FIG. 3 by the maxima 27 of significantly lower value for the force F at φ=0° and at φ=360°.

The edge 17 behaves similarly. As is clear from FIG. 3, in the immediate vicinity of the edge 17 at φ=0° and 360°, there is a cut recess comprised of the parts 7' and 7" whereas in the immediate vicinity of the edge 15 at φ=0° and 360°, there is a split bridge piece 19 with the halves 19' and 19". This results in a somewhat different force curve over the circumference of the edge 17.

As is clear from the lower F/φ graph in FIG. 3, there are four maxima 27 and two local maxima 29 in the vicinity of the edges 11 and 13 at the angles φ=30° and 330° that are significantly lower than the maxima 27.

As a result of this circumferentially uneven transmission of force between the upper cover plate 6 and the edge 15 on the one hand and between the lower cover plate 5 and the edge 17 on the other hand, the hollow body 4 produces a bending moment that acts on the upper cover plate 6 and the lower cover plate 5 when the hollow body 4 is attached with a prestressing force to the upper and lower cover plates 6, 5. This bending moment is naturally also transmitted to the piezoelectric actuator 1, which has an unfavorable effect on its operational reliability and lifespan. This bending moment is also undesirable in hydraulic valve elements actuated by the actuator unit.

FIG. 4 shows a perspective view of a hollow body 4, which has been manufactured from a blank 9 shown in FIG. 3. The rows of recesses 7, which are not individually labeled in FIG. 4, constitute sixteen planes $E_1$ to $E_{16}$ that extend perpendicular to the longitudinal axis 35 of the hollow body 4. To illustrate this, one plane $E_2$ is indicated in FIG. 4. The wall thickness s of the hollow body 4 is also indicated in FIG. 4.

FIG. 5 shows a blank 9 that can be used to manufacture a hollow body 4 according to the present invention. It is clear from the full depiction of the blank 9 that a total of seventeen rows of recesses 7 are provided. When the blank 9 is formed into a hollow body, these seventeen rows constitute seventeen planes in which the recesses 7 are disposed. The edges 11 and 13 constitute the joint 31 in the hollow body. The edges 17 and 15 constitute a first end and a second end in the finished hollow body 4. This is why in connection with the finished hollow body 4, the reference numeral 17 is used for the first end of the hollow body 4 and the reference numeral 15 is used for the second end of the hollow body 4.

According to the present invention, in the blank 9, the recesses 7a and 7b adjacent to the edges 11 and 13 have a geometry that has been altered in comparison to the rest of the recesses 7, not all of which have been provided with reference lines. The different geometries of the recesses 7, 7a, and 7b will be explained in greater detail below in conjunction with the detail A from the blank 9. In this exemplary embodiment, the recesses 7a and 7b have the same geometry. As is clear from FIG. 4, the recesses 7, 7a, and 7b are "bone-shaped." Each recess 7, 7a, 7b is comprised of a middle portion 37 and two head portions 39 adjoining this. The reference numerals 37 and 39 have been attached by way of example to only a single recess 7. The head portion 39 can be quantitatively described by a first radius $R_1$ while the middle portion 37 can be quantitatively described by a second radius $R_2$. Another important geometric value of the recesses 7, 7a, and 7b is the length L. It has turned out to be advantageous here if the first radius of the recesses 7a and 7b is smaller by a factor of 0.867 than the first radius of the recesses 7. It has also turned out to be advantageous if the second radius $R_2$ (7a, 7b) of the recesses 7a and 7b is greater by a factor of 1.317 than the second radius $R_2$ of the recesses 7 and if the length L of the recesses 7a and 7b is shorter by a factor of 0.984 than the length of the recesses 7.

There is a bridge piece 19 between each pair of recesses 7. The first row of recesses 7 that are disposed in the immediate vicinity of the edge 17 is comprised of six recesses 7. The six recesses 7 of the first row are disposed so that one recess is split. This recess 7 is divided into two symmetrical halves by the edges 11 and 13.

The second row contains four recesses 7 and one each of recesses 7a and 7b. The recesses 7a and 7b are disposed so that they are in the immediate vicinity of the edges 11 and 13. Since the recesses 7a and 7b are smaller than the recesses 7, the hollow body 4 is reinforced at a circumference angle φ of 30° and a circumference angle φ of 330°, namely in those places where the recesses 7a and 7b influence the spring rate of the hollow body 4. This reinforcing in the region of the circumference angles of φ=30° and 330° compensates for the weakening of the hollow body 4 by the joint 31 disposed between the edges 11 and 13 (see FIG. 4). The result of this measure is clearly shown in the F/φ graph shown above the blank 9. In comparison to FIG. 3, in which there is a significant drop in the transmittable force in the vicinity of the circumference angles φ=30° and 330°, in the F/φ graph in FIG. 5, there are six maxima 27, that all represent the same amount. This means that a hollow body 4 manufactured from the blank 9 according to FIG. 5 has a uniform spring rate over the circumference of its ends 15 and 17 so that the spring force transmitted by the hollow body 4 to an upper or lower cover plate and/or a shoulder 91 or 93 acts exclusively in the axial direction and does not exert any lateral forces or bending moments on the components on which the spring force of the hollow body 4 acts. A blank 9 according to FIG. 5 can therefore attain the object according to the present invention.

With regard to the width of the bridge pieces 19, which is labeled with "a" in detail A, and the width "b" of the half bridge pieces 41 between a recess 7a and the edge 11 and between a recess 7b and the edge 17, respectively, the following quantitative relationship has turned out to be advantageous. The width b of the half bridge piece 41 should be greater than a/2, in particular, should reflect the equation b=1.4·a/2.

Figure 6:
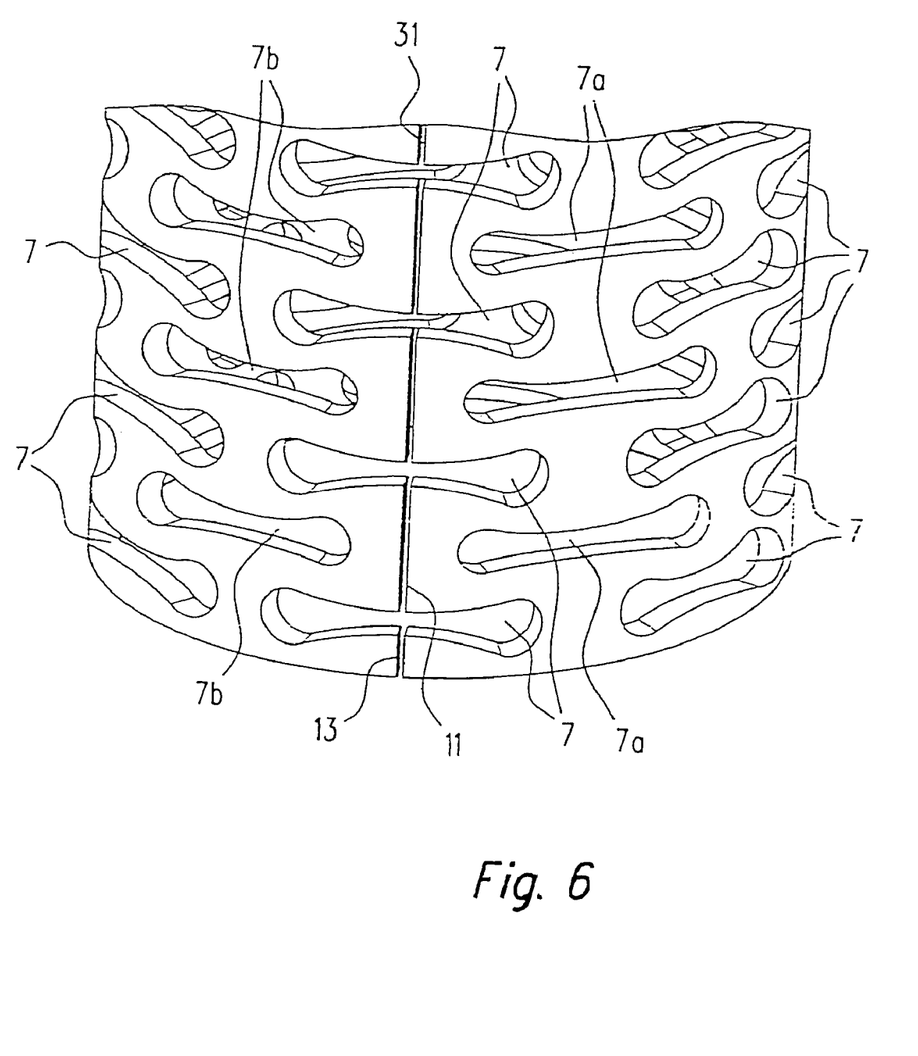
FIG. 6 shows a perspective view of a hollow body that has been bent from a blank according to FIG. 5.

FIG. 6 is a perspective view of a detail from a hollow body 4 according to the present invention. It is clear from this depiction that the recesses 7a and 7b are disposed in the immediate vicinity of the joint 31.

Figure 7:
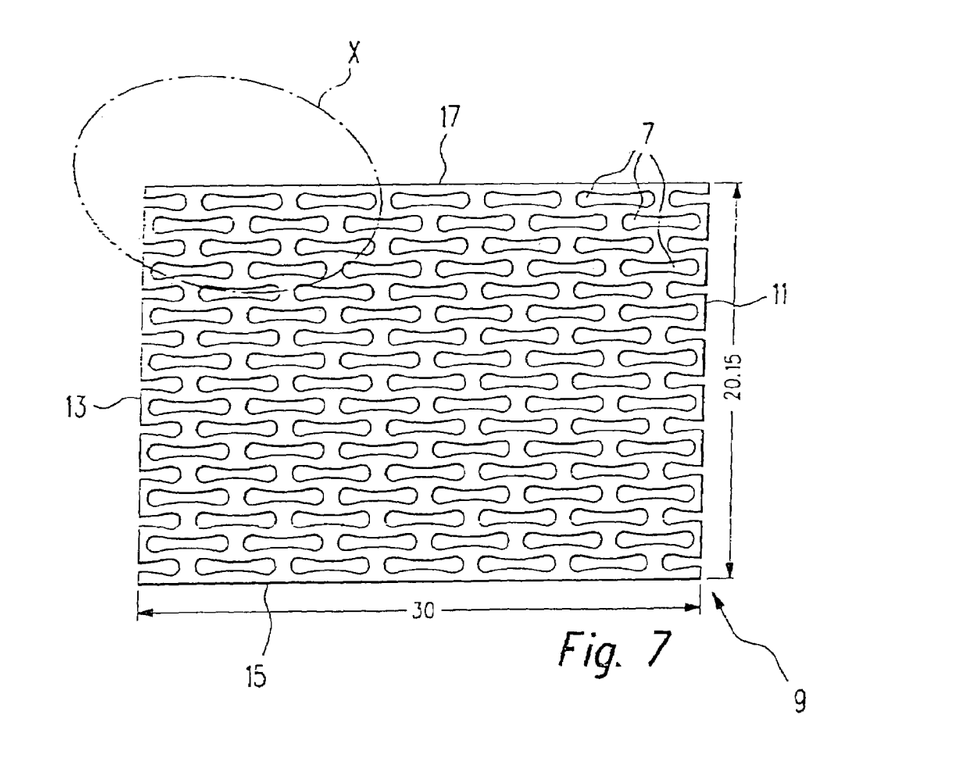
FIG. 7 shows another exemplary embodiment of a blank for manufacturing a hollow body according to the present invention.

FIG. 7 depicts a blank 9 and a detail of the blank 9, which show the dimensions of the recesses 7 and of the entire blank. This blank 9 has only recesses 7 and no recesses with the different geometry (7a and 7b).

Figure 8A:
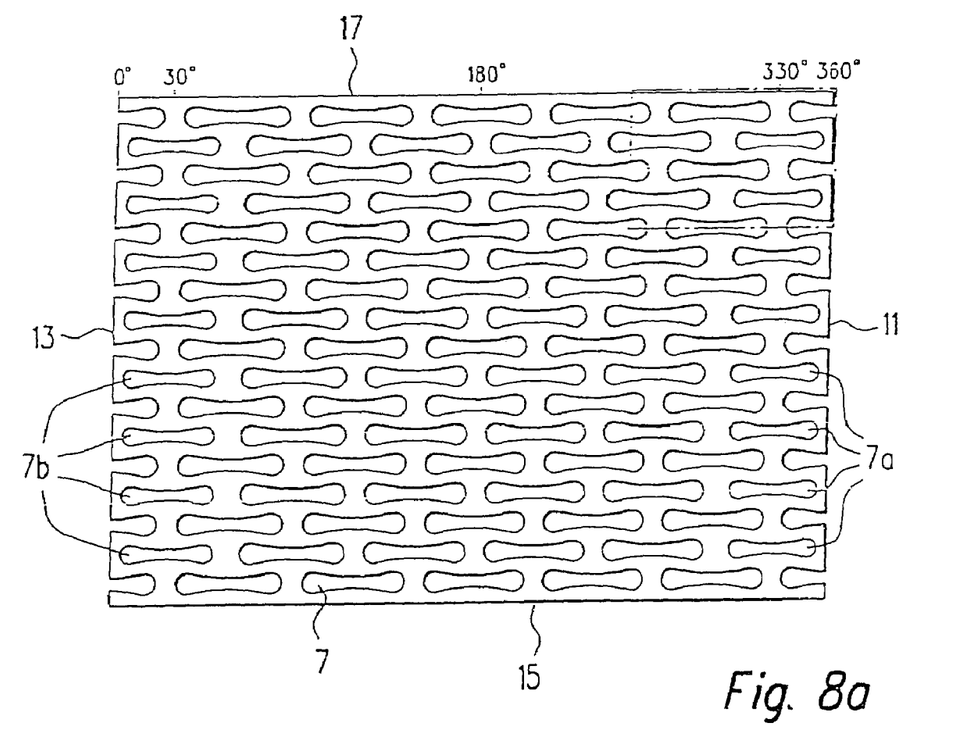
FIG. 8 shows another exemplary embodiment of a blank for manufacturing a hollow body according to the present invention.
Figure 8B:
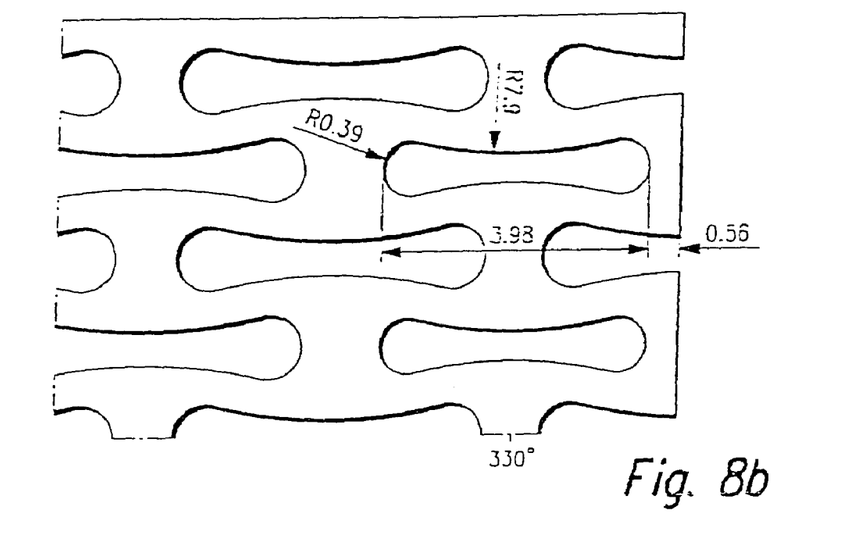
Figure 8C:
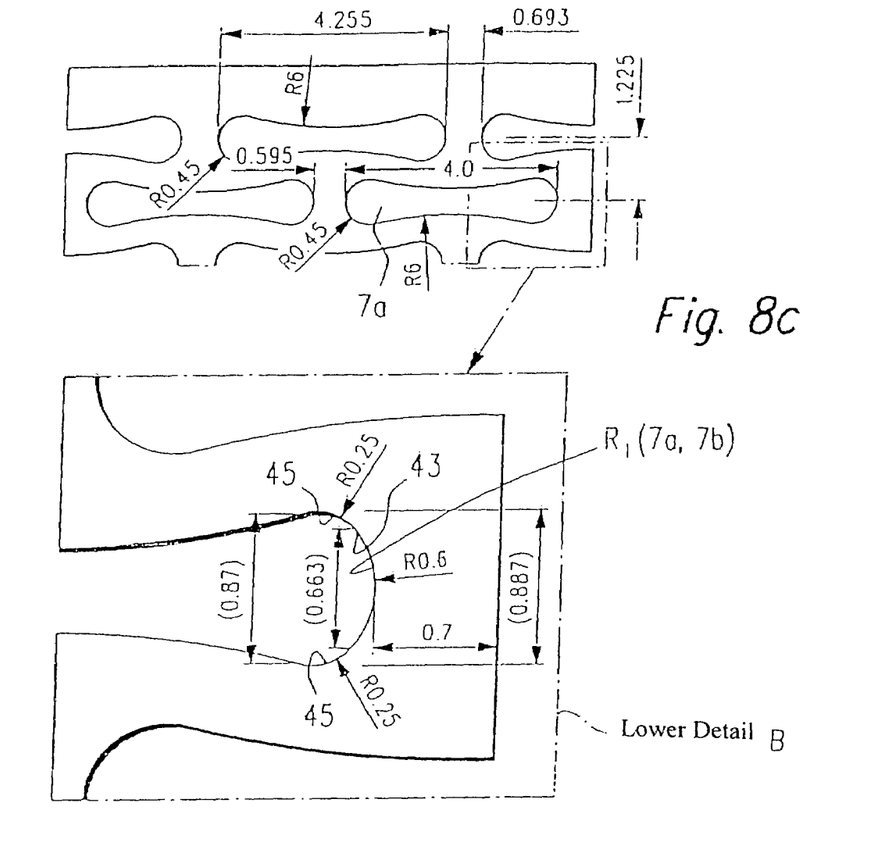

FIGS. 8a, 8b, and 8c show blanks 9 or details of blanks 9, with a dimensional depiction of the recesses 7a and 7b adjacent to the joint 31. These exemplary embodiments are also able to attain the object underlying the present invention, which is essentially comprised in achieving a prestressing of the piezoelectric actuator 1 and 79 in the axial direction without exerting any lateral forces.

The embodiment forms whose details are depicted in FIGS. 8b and 8c have also turned out to be advantageous. A detailed explanation of this has been omitted here since the dimensions furnished in the above-mentioned figures are self-explanatory and the principle design of such a blank 9 has been described in detail in conjunction with FIGS. 3 and 5.

However, reference is made to the lower detail B in FIG. 8c. In it, the first radius $R_1$ of the recesses 7a and 7b at the end oriented toward the edges 11 and 13 (not shown) is composed of three arc segments 43. In the middle, there is a first arc segment 43 with a radius of 0.6 mm, which is adjoined at both ends by two second arc segments 45 with a radius of 0.25 mm. The recesses 7a and 7b whose geometry is described in conjunction with FIG. 8c are exemplary embodiments for recesses in which the first radii of the head portions of a recess 7a or 7b adjacent to the joint differ from each other.

Figure 9:
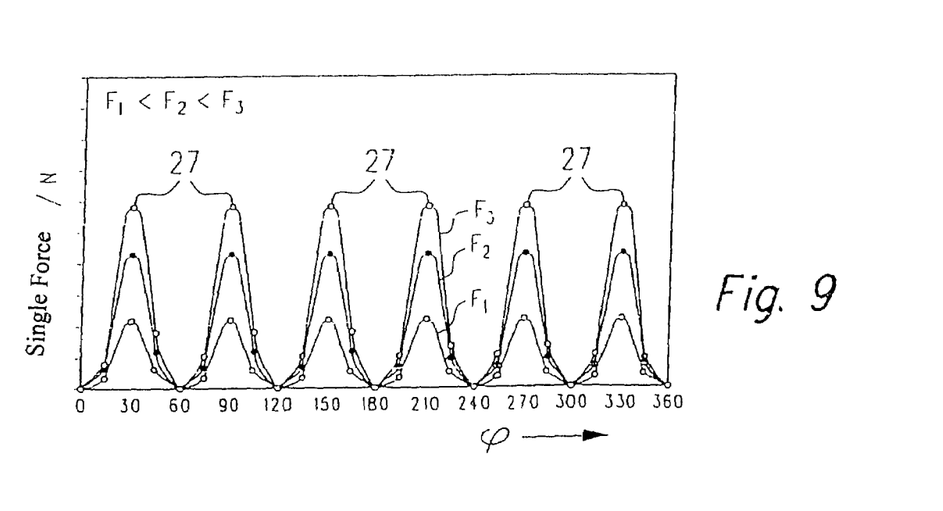
FIG. 9 depicts the forces that can be transmitted to a hollow body according to the present invention according to FIG. 8.

FIG. 9 is an F/φ graph of a hollow body 4 manufactured from a blank according to FIG. 8, in various load states. Three lines that correspond to three different forces F1, F2, and F1 depict the load states. It is clear from FIG. 9 that the spring rate of the hollow body 4 is constant over the circumference in a wide range of load states.

Figure 10A:
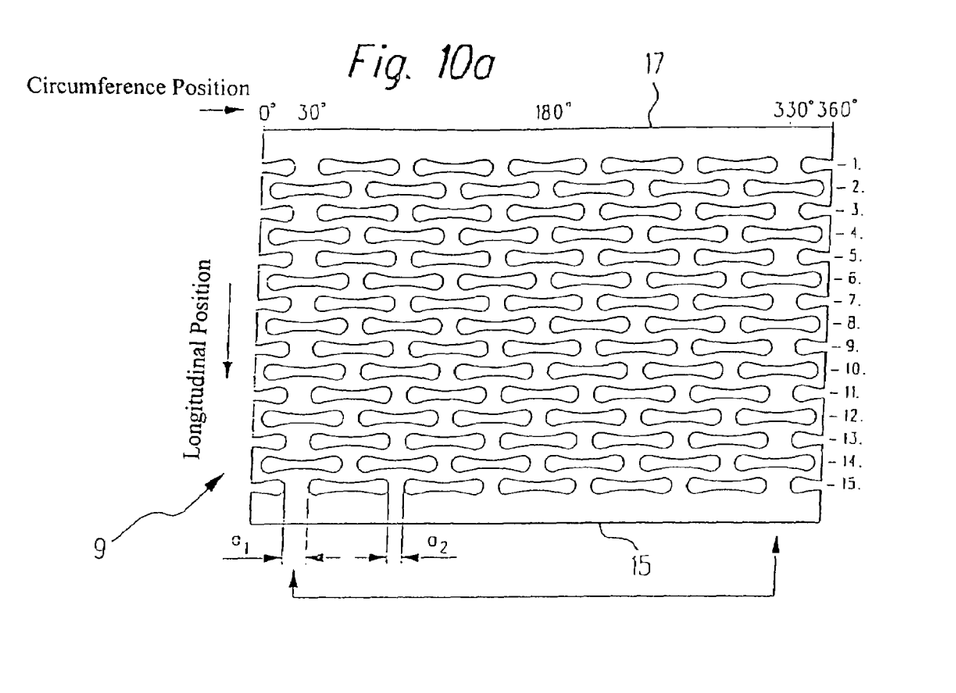
FIG. 10 shows another exemplary embodiment of a blank for manufacturing a hollow body according to the present invention.

FIG. 10 shows another exemplary embodiment of a blank 9 for manufacturing a hollow body 4 according to the present invention. The blank 9 has the following differences from the blanks described above:

The blank 9 is not perforated in the region of the edges 15 and 17 that correspond to a second end and a first end of the hollow body 4. This reinforces the hollow body 4 in the region of its first end 17 and in the region of its second end 15, which reduces the value of the maxima 27 (see FIG. 3, FIG. 5, and FIG. 9).

Figure 10B:
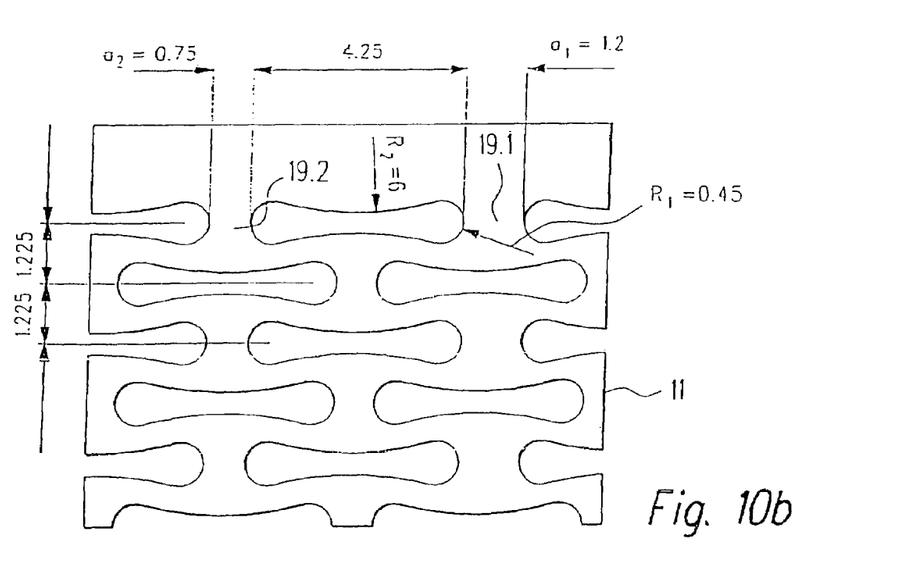
Figure 11:
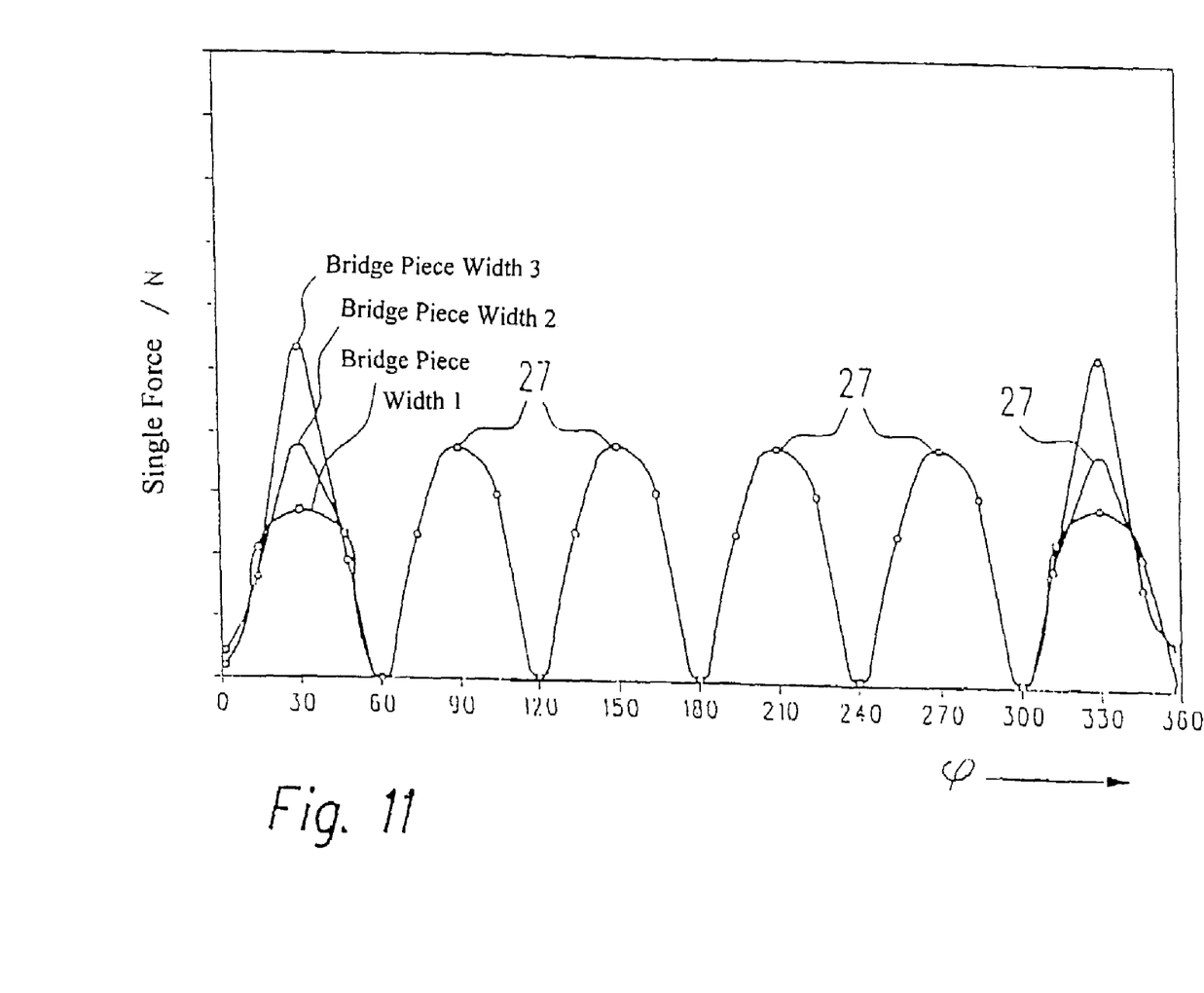
FIG. 11 depicts the forces that can be transmitted to a hollow body according to the present invention according to FIG. 10.

A second essential measure for improving the hollow body 4 is comprised in individually adapting the width a of the bridge pieces 19 to the loads that occur. The bridge piece 19.1 in the first row of recesses 7 that are disposed in the immediate vicinity of the edges 11 and 13 is thus wider than a bridge piece 19.2 that is disposed in the blank, farther away from the edges 11 and 13. In the exemplary embodiment shown, the width $a_1$ of the bridge piece 19.1 adjacent to the edges 11 and 13 is 1.2 mm, whereas the other bridge pieces 19.2 have a width $a_2$ of only 0.75 mm. Depending on the dimensioning of the bridge piece widths $a_1$ and $a_2$, there can even be an overcompensation for the weakening of the hollow body 4 due to the presence of the joint 31. This effect is demonstrated in FIG. 11, which is an F/φ graph. If the bridge piece width $a_1$ is selected as shown in FIG. 10b, then all six maxima 27 are of the same amount. This design is indicated in FIG. 10b by the "bridge piece width $a_1$=1.2". If the bridge piece width in the immediate vicinity of the edges 11 and 13 is further increased, then the spring rate of the hollow body at the circumference angles φ=30° and φ=330° is greater than in the angle regions between them. This results in a superelevation of the curve in the vicinity of the circumference angles 30° and 330°, which is indicated in FIG. 11 by the line "bridge piece width 3."

Figure 12:
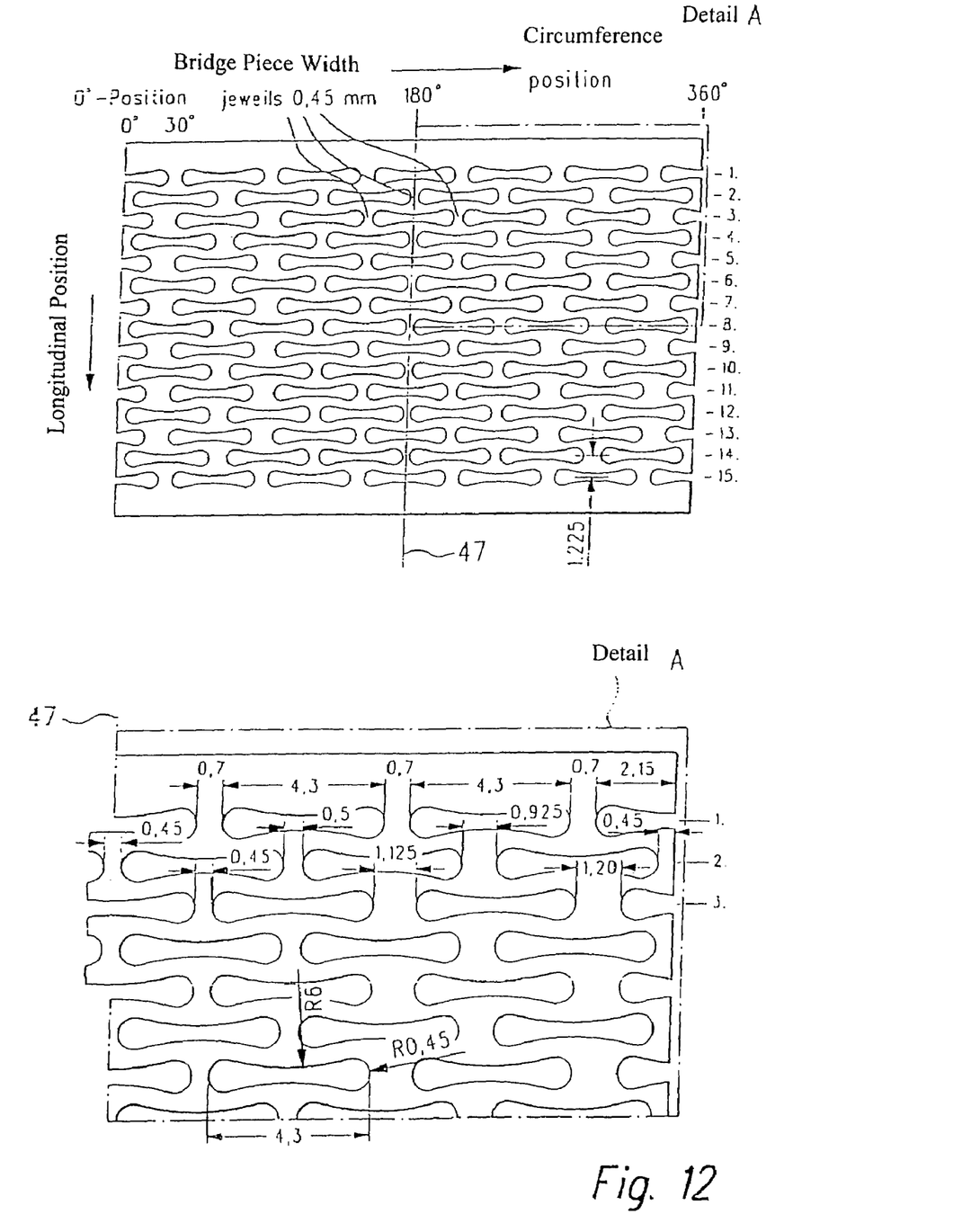
FIG. 12 shows another exemplary embodiment of a blank for manufacturing a hollow body according to the present invention, and FIG. 13 schematically depicts a fuel injection system.

FIG. 12 shows another exemplary embodiment of a blank 9 according to the present invention in which the bridge piece widths have been individually determined as a function of the load situation. The blank 9 is symmetrical in relation to a symmetry axis 47 so that the dimensioning of the detail A, which depicts a quadrant of the blank 9, represents by reflection the overall dimensions of the entire blank 9 (not shown). The reference numerals 7, $R_1$, $R_2$, L, 19, 21, and others have been omitted from FIG. 12 for the sake of clarity. It should also be noted with regard to FIG. 12 that the same bridge piece widths are provided in the first row of recesses and in the 15th row of recesses. In addition, the bridge piece widths are the same in the second, fourth, sixth, eight, tenth, and fourteenth row of recesses. The bridge piece widths are also the same in the third, fifth, seventh, ninth, eleventh, twelfth, and thirteenth rows of recesses.

Figure 13:
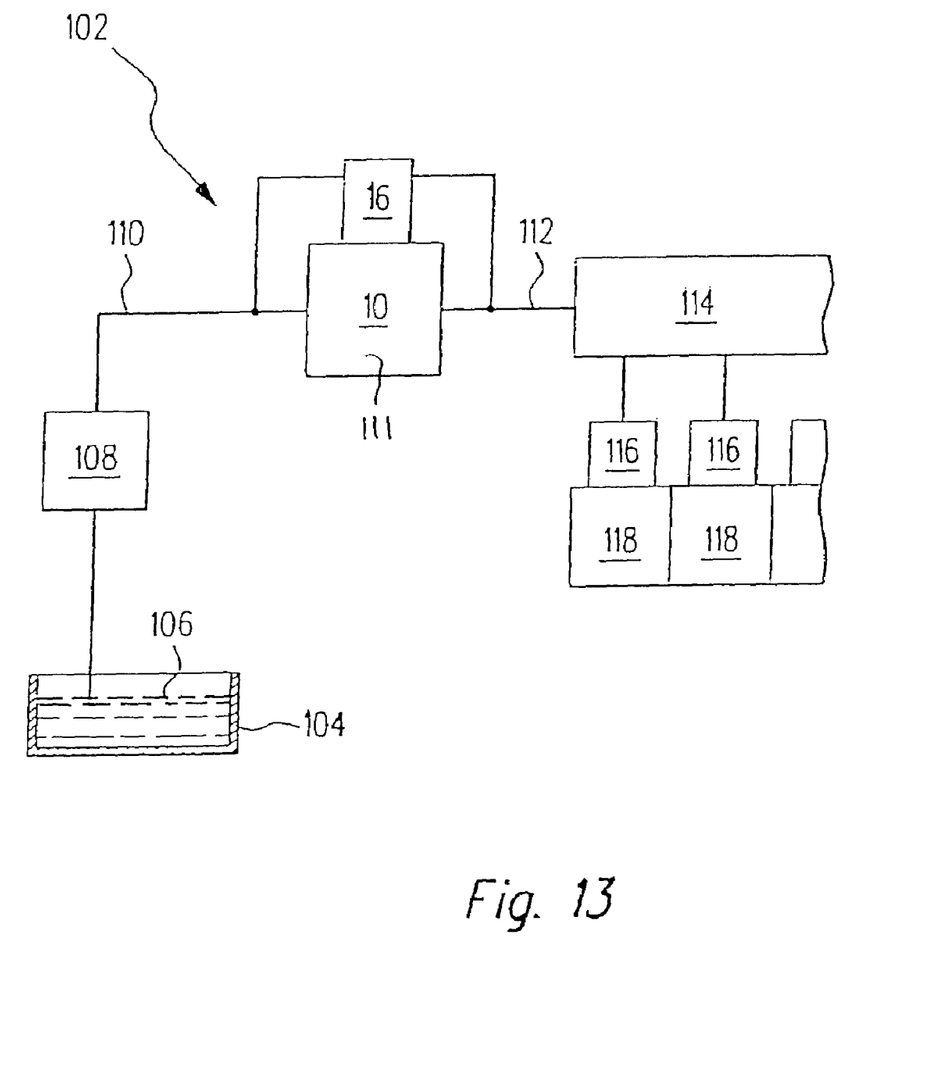

In conjunction with FIG. 13, the description below is intended to describe how the fuel injection valve 116 according to the present invention is integrated into a fuel injection system 102 of an internal combustion engine. The fuel injection system 102 has a fuel tank 104 from which an electrical or mechanical fuel pump 108 delivers fuel 106. It feeds the fuel 106 via a low-pressure fuel line 110 to a high-pressure fuel pump 111. From the high-pressure fuel pump 111, the fuel 106 travels to a common rail 114 via a high-pressure fuel line 112. A number of fuel injection valves 116 are connected to the common rail and inject the fuel 106 directly into combustion chambers 118 of an internal combustion engine that is not shown.

As a matter of course, each of the characteristics described in the specification, illustrated in the drawings, or recited in the claims can be essential to the present invention either individually or in combination with other characteristics.

The foregoing relates to preferred exemplary embodiments of the invention, it being understood that other variants and embodiments thereof are possible within the spirit and scope of the invention, the latter being defined by the appended claims.

The invention claimed is:

1. An actuator unit having an elongated hollow body (4) which is elastically embodied and which prestresses a piezoelectric actuator (1),
the hollow body (4) having a plurality of recesses and having a joint (31) extending parallel to its longitudinal axis (35), a bridge piece (19) between each pair of adjacent recesses (7, 7a, 7b), the hollow body (4) having a first end (17) and a second end (15), and the recesses (7a, 7b) adjacent to the joint (31) being smaller than the rest of the recesses (7).

2. An actuator unit comprising an elongated a hollow body (4) having a longitudinal axis (35) and a piezoelectric actuator (1), the hollow body (4) being elastically embodied and prestressing the actuator (1), the hollow body (4) having a plurality of recesses distributed thereover with bridge pieces between adjacent recesses, and having a joint (31) extending parallel to its longitudinal axis (35) with a bridge piece (19) between each pair of adjacent recesses (7, 7a, 7b), the bridge piece (19.1) between a recess (7a, 7b) adjacent to the joint (31) and another recess (7) adjacent to that recess being wider than the bridge pieces (19.2) between the rest of the recesses (7).

3. The actuator unit according to claim 2, wherein the ratio of the width of a bridge piece (19.1) between a recess (7a, 7b) adjacent to the joint (31) and another recess (7) adjacent to that recess (7a, 7b) to the width of the rest of the bridge pieces (19.2) has a value between 1.3 and 1.9, preferably about 1.6.

4. The actuator unit according to claim 2, wherein the widths of the bridge pieces (19.1, 19.2) are dimensioned as a function of the load, and wherein the widths (a, $a_1$, $a_2$) of the bridge pieces (19) differ from one another by a factor of about 3.

5. The actuator unit according to claim 2, wherein the recesses (7) are disposed in a number of planes ($E_i$) and the planes ($E_i$) extend parallel to one another.

6. The actuator unit according to claim 5, wherein there is an odd number (I, where I=11, 13, 15, or 17, for example) of planes ($E_i$) in which the recesses (7) are disposed.

7. The actuator unit according to claim 6, wherein the recesses (7a, 7b) adjacent to the joint (31) have the following dimensions:
$R_1$(7a, 7b)=0.41 mm to 0.49 mm,
$R_2$(7a, 7b)=5.5 mm to 6.5 mm,
L (7a, 7b)=3.7 mm to 4.7 mm.

8. The actuator unit according to claim 5, wherein a number of recesses (7) are disposed one after the other in a plane ($E_2$), and wherein the plane ($E_2$) intersects the longitudinal axis (35) of the hollow body (4) at a right angle.

9. The actuator unit according to claim 8, wherein a plane ($E_2$) contains an even number of recesses (7).

10. The actuator unit according to claim 5, wherein the recesses (7) of two adjacent planes ($E_1$) are offset (23) from one another.

11. The actuator unit according to claim 10, wherein the offset (23) of the recesses (7) of two adjacent planes is equal to one half the repeat pattern (21) of the recesses (7) of a plane ($E_1$).

12. The actuator unit according to claim 2, wherein the recesses (7) are embodied as bone-shaped and extend lateral to a longitudinal axis (35) of the hollow body (4).

13. The actuator unit according to claim 12, wherein the recesses (7) are comprised of a middle portion (37) and two head portions (39), the head portions (39) having at least one first radius ($R_1$), the middle portion (37) having a second radius ($R_2$), the recesses (7, 7a, 7b) having a length (L), and the following equations apply to the ratios of the recesses (7) disposed in the inner region of the blank to the recesses (7a, 7b) disposed adjacent to the joint (31):
$R_1$(7a, 7b)=0.867×$R_1$(7)
$R_2$(7a, 7b)=1.317×$R_2$(7)
L (7a, 7b)=0.984×L (7), and width (b) of a halved bridge piece (41) in relation to the joint:
b>a/2; in particular b=1.4×a/2.

14. The actuator unit according to claim 12, wherein the recesses (7a, 7b) adjacent to the joint (31) have the following dimensions:
$R_1$(7a, 7b)=0.35 mm to 0.43 mm
$R_2$(7a, 7b)=4.0 mm to 8.9 mm
L (7a, 7b)=3.5 mm to 4.5 mm.

15. The actuator unit according to claim 12, wherein the recesses (7) have the following dimensions:
$R_1$(7)=0.43 mm to 0.51 mm,
$R_2$(7)=4.0 mm to 4.8 mm,
L (7)=4.5 mm to 5.5 mm.

16. The actuator unit according to claim 12, wherein the recesses (7) have the following dimensions:
$R_1$(7)=0.4 mm to 0.5 mm,
$R_2$(7)=5.5 mm to 6.5 mm,
L (7)=4.0 mm to 4.5 mm.

17. The actuator unit according to claim 12, wherein the recesses (7) are comprised of a middle portion (37) and two head portions (39), the head portions (39) having at least one first radius ($R_1$), the middle portion (37) having a second radius ($R_2$), the recesses (7, 7a, 7b) having a length (4), the first radii of the head pieces (39) of a recess (7a, 7b) adjacent to the joint (31) are different from each other.

18. The actuator unit according to claim 2, wherein the hollow body (4) has a circular cross section.

19. The actuator unit according to claim 2, wherein the cross section of the hollow body (4) is the shape of a regular polygon.

20. The actuator unit according to claim 2, wherein the hollow body (4) is radially fixed at its first end (17).

21. The actuator unit according to claim 20, wherein the first end (17) of the hollow body (4) is radially affixed to an upper cover plate (6) or an adjusting disk (93) by means of an annular groove (39) or a shoulder.

22. The actuator unit according to claim 21, wherein the first end (17) of the hollow body (4) being fastened to the upper cover plate (6) by means of welding (41).

23. The actuator unit according to claim 2, wherein the hollow body (4) is radially fixed at its second end (15).

24. The actuator unit according to claim 23, wherein the second end (15) of the hollow body (4) is connected to a lower cover plate (5) or a coupler housing (86).

25. The actuator unit according to claim 24, wherein the second end (15) of the hollow body (4) is fastened to the lower cover plate (5) or a coupler housing (86) by means of welding (41).

26. The actuator unit according to claim 2, wherein the first end (17) and/or the second end (15) of the hollow body (4) has a region that is not perforated by recesses (7, 7a, 7b).

27. The actuator unit according to claim 2, wherein the piezoelectric actuator (1) is disposed inside the hollow body (4) and the prestressed hollow body (4) acts on the piezoelectric actuator (1) with compression.

* * * * *